United States Patent [19]

Okada et al.

[11] 4,251,812
[45] Feb. 17, 1981

[54] REMOTE CONTROL SYSTEM

[75] Inventors: Hisao Okada, Yokohama; Takao Mogi; Shigetoshi Murakami, both of Tokyo, all of Japan

[73] Assignee: Sony Corporation, Tokyo, Japan

[21] Appl. No.: 953,494

[22] Filed: Oct. 23, 1978

[30] Foreign Application Priority Data

Oct. 27, 1977 [JP] Japan .................. 52-128916

[51] Int. Cl.³ .................................. H03K 7/08
[52] U.S. Cl. .................. 340/696; 340/167 A; 375/22
[58] Field of Search ............. 325/37, 55, 64, 141, 325/143; 343/225; 340/167 R, 167 A, 171 R, 539, 164 R, 167 P, 694, 695, 696; 179/15 AW, 15 BA; 250/199; 370/9, 91, 92; 375/22, 59, 68

[56] References Cited

U.S. PATENT DOCUMENTS

| 2,617,873 | 11/1952 | Lovell-foot et al. | 325/37 |
| 2,871,290 | 1/1959 | Earp | 179/15 AW |
| 3,257,651 | 6/1966 | Feisel | 325/143 |
| 3,852,713 | 12/1974 | Roberts et al. | 340/164 R |
| 4,007,455 | 2/1977 | Mabuchi et al. | 343/225 |
| 4,072,898 | 2/1978 | Hellman et al. | 340/167 A |

FOREIGN PATENT DOCUMENTS 2805068  2/1977  Fed. Rep. of Germany ...... 340/167 A

Primary Examiner—Benedict V. Safourek
Attorney, Agent, or Firm—Lewis H. Eslinger; Alvin Sinderbrand

[57] ABSTRACT

A remote control apparatus is constituted by a command encoding device and a command decoding device. In the command encoding device, a timing pulse generator indicates the beginning and end of a time interval of a length which is a function of a command to be encoded, a pulse of the first duration shorter than said time interval is initiated in response to said beginning of the time interval, a pulse of a second duration different from said first duration and shorter than said time interval is initiated in response to said end of the time interval, and said pulses of said first and second duration respectively, are sequentially transmitted in the command decoding device, upon the receipt of a pulse of said first duration followed by a pulse of said second duration, a first indication is produced in response to the receipt of said pulse of the first duration and a second indication is produced in response to the receipt of said pulse of the second duration, and a device provides a value which varies as a function of the length of time between each said second indication which immediately precedes it, whereupon, a command signal is produced as a function of said value.

10 Claims, 32 Drawing Figures

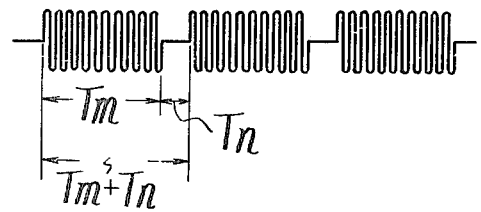
FIG. 1 PRIOR ART
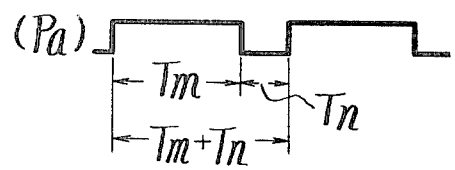
FIG. 2A
FIG. 2B
FIG. 2C
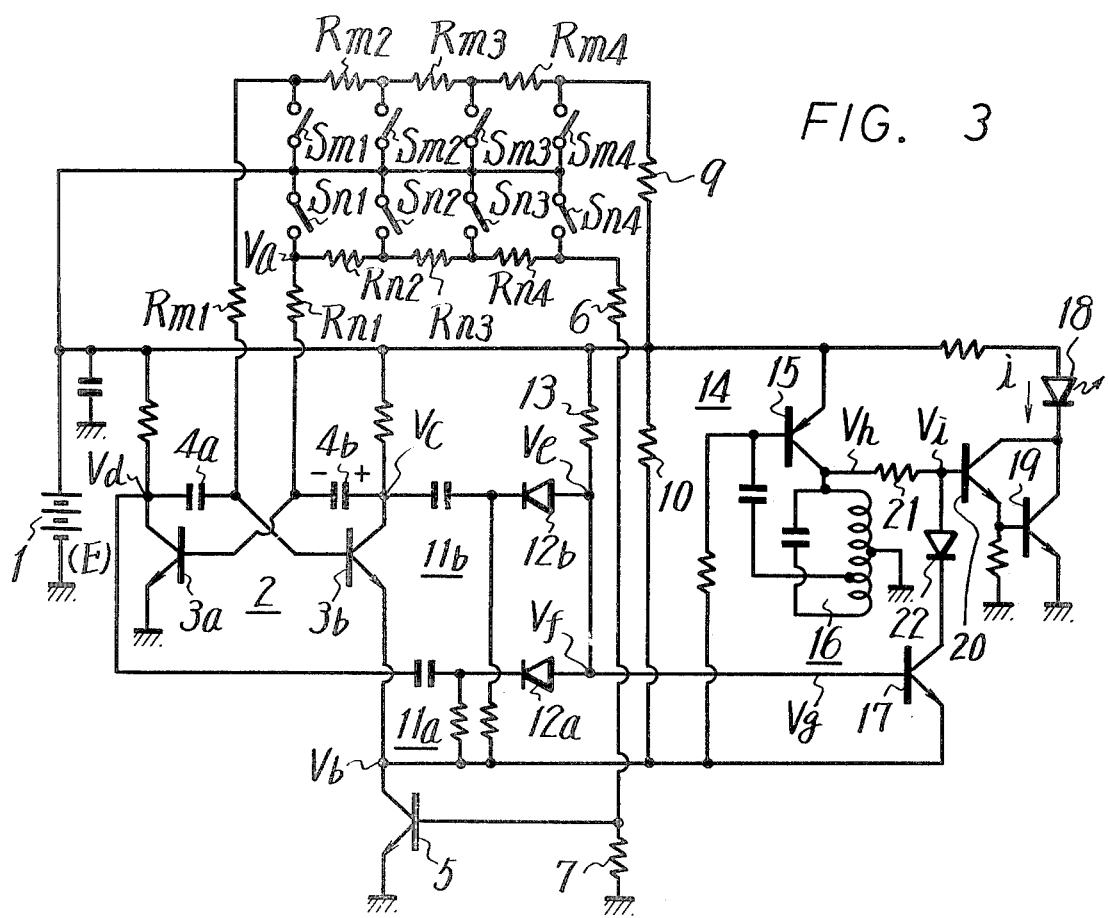
FIG. 3

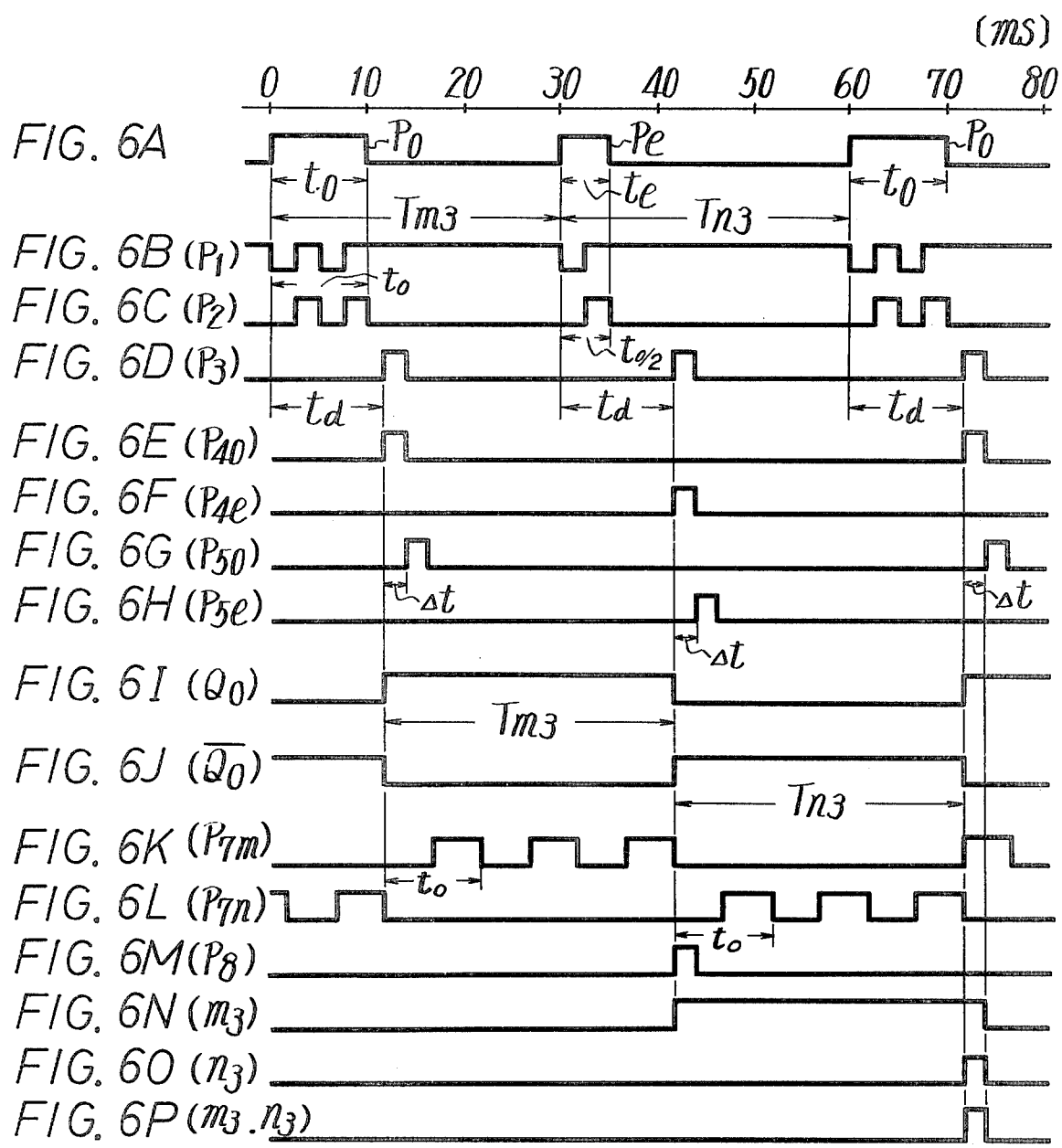

REMOTE CONTROL SYSTEM

BACKGROUND OF THE INVENTION

1. Field of the Invention

The present invention relates generally to remote control apparatus, and is directed more particularly to remote control apparatus in which both the likelihood of errors caused by noise and the power required for transmission are reduced.

2. Description of the Prior Art

Remote control apparatus is well known in the prior art. For example, U.S. Pat. No. 3,678,392 discloses a pulse width modulation (PWM) remote control system in which the duration of pulse signals are varied in accordance with the particular command which is to be communicated. It is also disclosed, for example, in U.S. application Ser. No. 846,445 filed on Oct. 28, 1977 that not only the duration of the pulse ($T_m$ in FIG. 1), but also the duration of time between pulses ($T_n$ in FIG. 1) can be varied in accordance with the particular command to be communicated.

In these prior art remote control systems, an ultrasonic, infra-red or similar carrier signal is continuously transmitted for the duration ($T_m$) of each pulse. This continuous transmission increases the energy required to transmit a command and it increases the likelihood that receipt of the carrier signal will be interrupted by an interferring signal capable of causing the command to be misread.

OBJECTS AND SUMMARY OF THE INVENTION

Accordingly, it is an object of this invention to provide a remote control apparatus that avoids the above-described defects of the prior art.

It is another object of this invention to provide a remote control apparatus tha requires less energy for the transmission of commands than such apparatus of the prior art.

It is a still another object of this invention to provide a remote apparatus that is less likely to misread a command because of interferring signals than such apparatus of the prior art.

It is yet another object of this invention to provide a remote control apparatus that is more advantageous for portable use than such apparatus of the prior art.

In accordance with an aspect of this invention a remote control apparatus has a command encoding device that includes means for indicating the beginning and end of a time interval of a length which is a function of a command to be encoded, means for initiating a pulse of a first duration shorter than said time interval in response to the beginning of said time interval, means for initiating a pulse of a second duration different from said first duration and shorter than said time interval in response to the end of the latter, and means for sequentially transmitting the pulses of said first and second durations, respectively. In a preferred embodiment the means for indicating the beginning and end of said time interval includes means for producing a timing pulse having a width corresponding to the length of said time interval and the means for initiating a pulse of said first duration and said second duration include means for detecting the leading and falling edge of the timing pulse, respectively. In one preferred embodiment, this means for producing a timing pulse can be repeatedly operative to produce a series of timing pulses with second time intervals interposed therebetween, each of said second time intervals being of a length which is also a function of the command to be encoded and which is longer than said first and second durations.

In accordance with another aspect of this invention, a remote control apparatus has a command decoding device that includes means for receiving a pulse of said first duration followed by a pulse of said second duration, means for producing a first indication in response to the receipt of said pulse of the first duration and for producing a second indication in response to the receipt of said pulse of the second duration, means for producing a value which varies as a function of the length of time between said second indication and said first indication which immediately precedes it, and means for providing a command signal as a function of said value. In a preferred embodiment the pulse receiving means receives a signal comprising alternations between pulses of said first and said second durations and a means is provided for producing a second value which varies as a function of the length of time between each said first indication and said second indication which immediately precedes it. In such an embodiment the means for providing a command signal does so also as a function of said second value.

The above and other objects, features, and advantages of the invention will be apparent in the following detailed description of illustrative embodiments of the invention which is to be read in connection with the accompanying drawings.

BRIEF DESCRIPTION OF THE DRAWINGS

FIGS. 1 and 2A to 2C, inclusive, are waveform diagrams used for explaining the present invention;

FIG. 3 is a circuit wiring diagram showing an example of a encoding device which embodies the present invention;

FIGS. 6A to 6P are waveform diagrams used for explaining the operation of the receiver shown in FIG. 5.

DESCRIPTION OF THE PREFERRED EMBODIMENT

Figure 4:
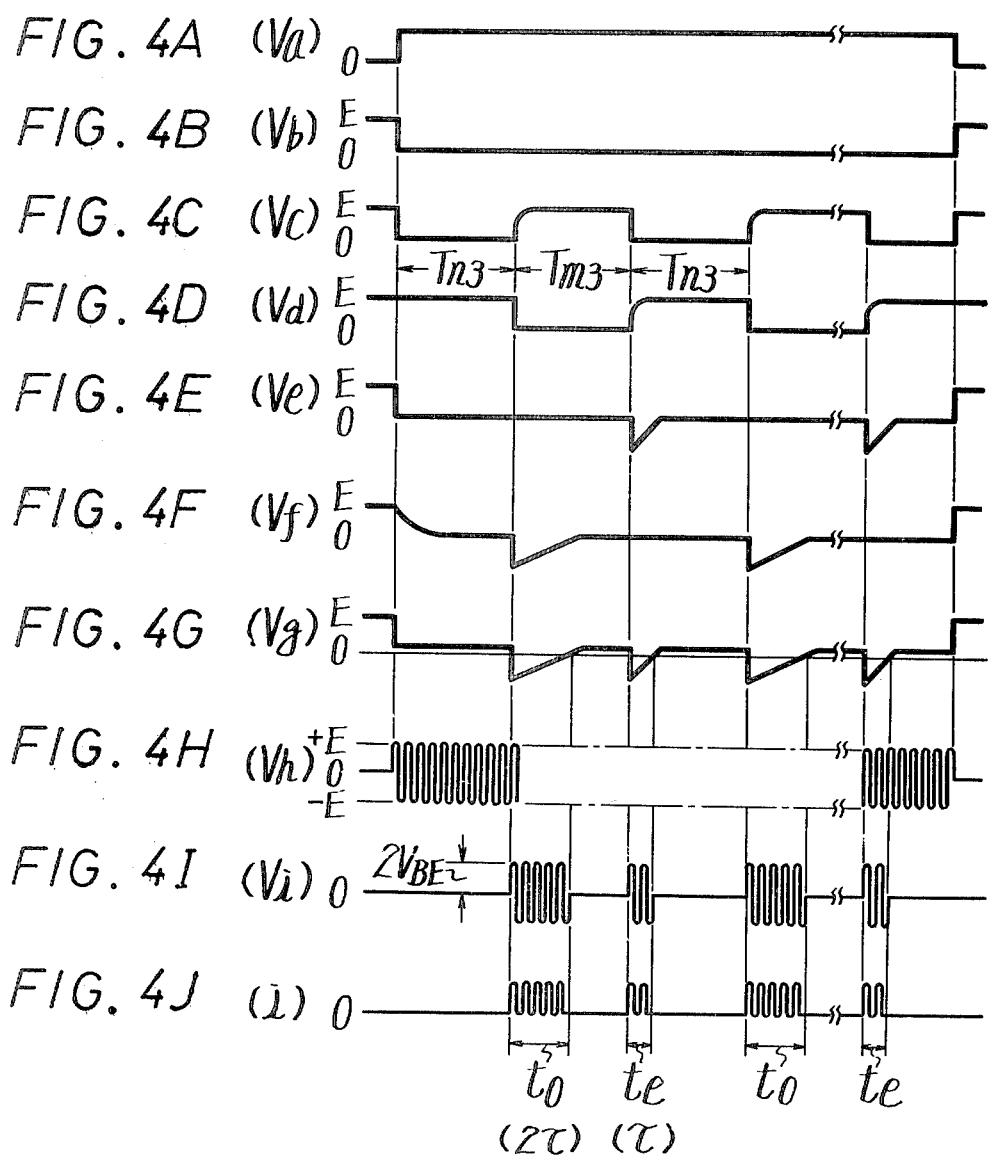
FIGS. 4A to 4J are waveform diagrams used for explaining the operation of the encoding device shown in FIG. 3.

Referring to the drawings in detail, and initially to FIG. 2A thereof, it will be seen that prior art remote control apparatus communicate commands by means of a pulse width modulated (PWM) signal having a pulse of a first duration $T_m$ followed by a pulse of a second duration $T_n$. Such prior art PWM signals are often used to modulate a carrier signal and thus to produce a signal such as that shown in FIG. 1, in which the carrier signal is transmitted for the period $T_m$, followed by a period $T_n$ during which it is not transmitted.

The present invention provides remote control apparatus which encodes and decodes commands in a PWM signal different from that shown in FIGS. 1 and 2A. Using, for purposes of illustration, the notation of FIGS. 2A, 2B and 2C, the present invention discloses a command encoding device comprising means for indicating the beginning and end of a time interval of a length $T_m$, which length is a function of a command to be encoded, means for initiating a pulse of a first duration $t_o$ shorter than time interval $T_m$ in response to the beginning of said time interval, means for initiating a pulse of a second duration $t_e$ different from the duration $t_o$ and shorter than time interval $T_m$ in response to the end of said time interval, and means for sequentially transmitting the pulses of duration $t_o$ and $t_e$ respectively. Such transmission may be accomplished by using such pulses to modulate a transmitted carrier signal and thus produce a signal such as that shown in FIG. 2C. In a preferred embodiment, the means for indicating the beinning and end of time interval $T_m$ is repeatedly operative to produce a series of such time intervals with second time intervals $T_n$ interposed between the successive time intervals $T_m$. In such an embodiment the time intervals $T_n$ have a length which is also a function of the command to be encoded and which is longer than pulse durations $t_o$ and $t_e$. In such a preferred embodiment, the means for indicating the beginning and end of a time interval $T_m$ could include a means for producing a timing pulse, which could also be called a command pulse, having a width corresponding to time interval $T_m$.

The present invention also discloses a command decoding device comprising means for receiving a pulse of a duration $t_o$ followed by a pulse of a duration $t_e$, means for producing a first indication in response to the receipt of said pulse of duration $t_o$ and for producing a second indication in response to the receipt of said pulse of duration $t_e$, means for producing a value which varies as a function of the length of time $T_m$ between said second indication and the first indication which immediately precedes it, and means for providing a command signal as a function of said value. In a preferred embodiment the command decoding device receives a signal comprising alternations between pulses of durations $t_o$ and $t_e$. In such an embodiment means can be provided for producing a second value which varies as a function of the length of time $T_n$ between each said first indication and said second indication which immediately precedes it, and the means for providing a command signal determines said command signal as a function also of said second value. The electric power required to transmit the prior art PWM signal shown in FIG. 1 is in proportion to $(T_m/T_m+T_n)$, while the present invention the electric power required to transmit the same command is in proportion to $$\frac{t_o + t_e}{T_m + T_n}.$$

Thus, since $t_o$ and $t_e$ can be selected so that their total is less than $T_m$, power consumption can be reduced. Similarly, since the total of $t_o$ and $t_e$ can be less than $T_m$, the present invention allows commands to be tramsmitted with a shorter total duration of carrier signal transmission than the prior art. This reduces the likelihood that the receipt of the carrier signal will be interrupted by interferring signals capable of causing the command being transmitted to be misread.

A command encoding device embodying the present invention will now be described with reference to FIG. 3. In this embodiment the first time interval $T_m$ can be of four different lengths $T_{m1}$, $T_{m2}$, $T_{m3}$, $T_{m4}$, and similarly the second time interval $T_n$ can be of four different lengths $T_{n1}$, $T_{n2}$, $T_{n3}$ and $T_{n4}$. As a result, 16 different commands can be obtained by combining a time interval $T_m$ and a time interval $T_n$. In this embodiment, these time intervals can have the following lengths:

| | |
|---|---|
| $T_{m1} = T_{n1} = \tau$, | $T_{m2} = T_{n2} = 2\tau$, |
| $T_{m3} = T_{n3} = 3\tau$, | $T_{m4} = T_{n4} = 4\tau$ | where $\tau$ is 10 ms (milli-seconds).

In FIG. 3, 1 designates an electric power source, such as a battery, having a voltage E. $S_{m1}$, $S_{m2}$, $S_{m3}$, $S_{m4}$, $S_{n1}$, $S_{n2}$, $S_{n3}$ and $S_{n4}$ are switches which are supplied with a voltage when an operating button (not shown) is turned on. Two of these switches, i.e., one of the switches $S_{m1}$ to $S_{m4}$ and one of the switches $S_{n1}$ to $S_{n4}$ are selectively closed, or turned ON, to determine the duration of the first and second time intervals $T_m$ and $T_n$, respectively, allowing a total of 16 different commands to be transmitted. As astable multivibrator 2 comprises a pair of transistors 3a and 3b, the collector of each of which is connected through a collector resistor directly to the battery 1. The collector of transistor 3a is also connected through a capacitor 4a to the base of transistor 3b, and the collector of transistor 3b is connected through a capacitor 4b to the base of transistor 3a. Between the battery 1 and the base of each transistor 3a and 3b is connected a time constant circuit which includes the above switches. The base of transistor 3b is connected to one end of a series of resistors $R_{m1}$, $R_{m2}$, $R_{m3}$ and $R_{m4}$. The switches $S_{m1}$ to $S_{m4}$ are inserted between the battery 1 and connection points of adjacent resistors $R_{m1}$ $R_{m4}$ respectively. Similarly, the base of the transistor 3a is connected to one end of a second series of resistors $R_{n1}$, $R_{n2}$, $R_{n3}$ and $R_{n4}$, and the switches $S_{n1}$ to $S_{n4}$ are interposed between the battery 1 and connection points of adjacent resistors $R_{n1}$ to $R_{n4}$, respectively.

Accordingly, the resistance of the time constant circuit connected to the base of the transistor 3b is determined by which one of the switches $S_{m1}$ to $S_{m4}$ is made ON, thus determining the duration of the first time interval $T_m$. Similarly, the resistance of the time constant circuit connected to the base of the transistor 3a is determined by which one of the switches $S_{n1}$ to $S_{n4}$ is made ON, thus determining the duration of the second time interval $T_n$.

In the encoding device shown in FIG. 3 a transistor 5 serves as a power switch, allowing the operation of the astable multivibrator 2 and an oscillator 14 (which will be described later) to be turned ON or OFF. The emitter of the transistor 5 is grounded. Its base is connected to the junction of resistors 6 and 7, which are connected in series between resistor $R_{n4}$ and ground. The collector of transistor 5 is connected through a resistor 10 to the battery 1. Accordingly, if any one of the switches $S_{n1}$ to $S_{n4}$ is turned ON, the transistor 5 turns ON, with the result that its collector, which is pulled up to the voltage E while all such switches are OFF, is grounded. Since the emitter of the transistor 3b is connected to the collector of transistor 5 and since the emitter of the transistor 3a is grounded, when the transistor 5 turns ON, the astable multibibrator 2 will start to change states. Similarly, since the base of a transistor 15 of the oscillator 14 is connected to the collector of transistor 5, the oscillator 14 will start to oscillate when the transistor 5 turns ON.

The collectors of transistors 3a and 3b are connected to differentiating circuits 11a and 11b, respectively. The time constants of differentiating circuits 11a and 11b are selected to correspond with the first duration $t_o$ of the pulse signal $P_o$ and the second duration $t_e$ of the pulse signal $P_e$, respectively. The negative pulses from the differentiating circuits 11a and 11b are added by diodes 12a and 12b, which are connected to one end of resistor 13, to constitute a carrier switching signal which is fed to the base of a transistor 17.

The oscillator 14 is a sinusoidal wave oscillator for generating a carrier signal. It includes the oscillating transistor 15 and an oscillation tuning circuit 16. The anode of an infra-red emitting diode 18 is connected to the battery 1 and its cathode is connected to ground through an output transistor 19. When the output transistor 19 turns ON, a current flows through the diode 18 in the forward direction, causing infra-red radiation to be emitted. The base of transistor 19 is connected to the emitter of a drive transistor 20, the base of which, in turn, is connected to the output of the oscillator 14 through resistor 21. In order to bypass the carrier signal generated at the collector of the oscillating transistor 15 around the base of the drive transistor 20 a counter current blocking diode 22 and the above mentioned transistor 17 are provided. When the transistor 17 is supplied with a forward bias voltage, it turn ON and the base of the transistor 20 is grounded through the transistors 17 and 5, bypassing the carrier signal around the base of transistor 20. Conversely, when the transistor 17 is turn OFF by a negative pulse from the differentiating circuits 11a or 11b, the carrier signal is not bypassed around, but rather is delivered to, the base of transistor 20.

The operation of the encoding device shown in FIG. 3 will now be described with reference to FIGS. 4A to 4J. By way of example, it will be assumed that switches $S_{m3}$ and $S_{n3}$ both have been selected. Before these switches are turned ON, however, the capacitor 4b of the astable multivibrator 2 is charged with the polarity shown in FIG. 3, whereas capacitor 4a remains uncharged. When the switches $S_{m3}$ and $S_{n3}$ are turned ON, a voltage $V_a$ at the connection point between the resistors $R_{n1}$ and $R_{n2}$ rises up (to a predetermined voltage) as shown in FIG. 4A. Accordingly, the transistor 5 turns ON and its collector voltage $V_b$ becomes the ground potential as shown in FIG. 4B. Thus, the astable multivibrator 2 and oscillator 14 each start to operate.

When the astable multivibrator 2 first starts to operate, the transistor 3b turns ON whereas the transistor 3a temporarily remains OFF, because of the charge remaining on capacitor 4b. After the time period $T_{n3}$, which is determined by the resistors $R_{n1}$, $R_{n2}$, $R_{n3}$ and the capacitor 4b a sufficient amount of charge is transferred to the base of transistor 3a to discharge capacitor 4b and to turn, the transistor 3a ON, which then causes transistor 3b to be turned OFF. Then, after the time period $T_{m3}$ which is determined by the resistors $R_{m1}$, $R_{m2}$, $R_{m3}$ and the capacitor 4a, the transistor 3b is again turned ON and the transistor 3a is turned OFF. Thereafter, the above operation will be repeated. As a result, collector voltages $V_c$ and $V_d$ of the transistors 3b and 3a become as shown in FIGS. 4C and 4D, respectively. Thus it can be seen that astable multivibrator 2, in conjunction with the switches and resistors which determine its time constants, constitutes means for indicating the beginning and end of time intervals $T_m$ and $T_n$. This multivibrator can also be thought of as means for producing a command pulse represented by the voltage $V_c$ at the collector of transistor 3b, the duration $T_m$ of which is a function of the command which is to be transmitted.

The complementary output voltages $V_c$ and $V_d$ from the astable multivibrator 2 at the collectors of the transistors 3b and 3a thereof are respectively applied to the differentiating circuits 11b and 11a. The negative circuit 11b generates a differentiated pulse $V_e$ of a second duration $t_e$ synchronized with the falling-edge of the output voltage $V_C$. This pulse is shown in FIG. 4E as it appears at the anode of the diode 12b. Similarly the differentiating circuit 11a generates a negative pulse $V_f$ of a first duration $t_o$ synchronized with the falling-edge of the output voltage $V_d$. This pulse is shown in FIG. 4F as it appears at the anode of the diode 12a. The pulses $V_e$ and $V_f$ corresponds to the pulses $P_e$ and $P_o$ shown in FIG. 2B, respectively. Owing to the dissimilar time constants of differentiating circuits 11a and 11b, the duration of pulse $V_f$ is longer than the duration pulse $V_e$. Pulses $V_e$ and $V_f$ are added to form a carrier switching signal, which is applied to the transistor 17 as base voltage $V_g$, shown in FIG. 4G. The differentiating circuits 11b and 11a can also be thought of, respectively, as means for producing leading edge and falling-edge signal pulses in response to the leading and falling edges of the command pulse represented by voltage $V_c$. Although circuit 11a responds to drops in the voltage $V_d$, it can be seen that such drops in voltage are caused by the rising edge of the command pulse $V_e$.

Since the oscillator 14 starts its operation when the switches are turned ON, a collector output $V_h$ of the oscillating transistor 15 becomes as shown in FIG. 4H. Only when the transistor 17 is turned OFF by the negative pulses $V_e$ and $V_f$ is the carrier applied to the base of the drive transistor 20. Therefore, the base voltage $V_i$ of the drive transistor 20 becomes a signal with an amplitude equal to the sum of the emitter-base voltages of the transistors 19 and 20 ($2V_{BE}$) and a waveform shown in FIG. 4I. This waveform corresponds to the transmitting signal $P_b$ shown in FIG. 2C. The voltage $V_i$ drives transistor 20 and 19 and causes a drive current i shown in FIG. 4J to flow through luminous diode 18. Thus it can be seen that luminous diode 18, in conjunction with oscillator 14 and transistors 17, 19 and 20, provides means for sequentially transmitting pulses of duration $t_o$ and $t_e$, which pulses can also be thought of as leading and falling edge signal pulses.

When the switches $S_{m1}$ to $S_{m4}$ are selectively made ON, as set forth above, the first time interval $T_m$ is determined, and when the switches $S_{n1}$ to $S_{n4}$ are selectively made ON, as set forth above, the second time interval $T_n$ is determined. At the initiation of the first interval $T_m$ the pulse signal $P_o$ having the first duration $t_o$ is generated, and at the termination of the first time interval $T_m$ the pulse signal $P_e$ having the second duration $t_e$ is generated.

When the operating button (not shown) is turned OFF the corresponding switches $S_{m1}$ through $S_{m4}$ and $S_{n1}$ through $S_{n4}$ and the transistor 5 are all turned OFF. As a result the astable multivibrator 2 and the oscillator 14 are similarly turned off and the encoding device returns to its initial standby state.

Figure 5:
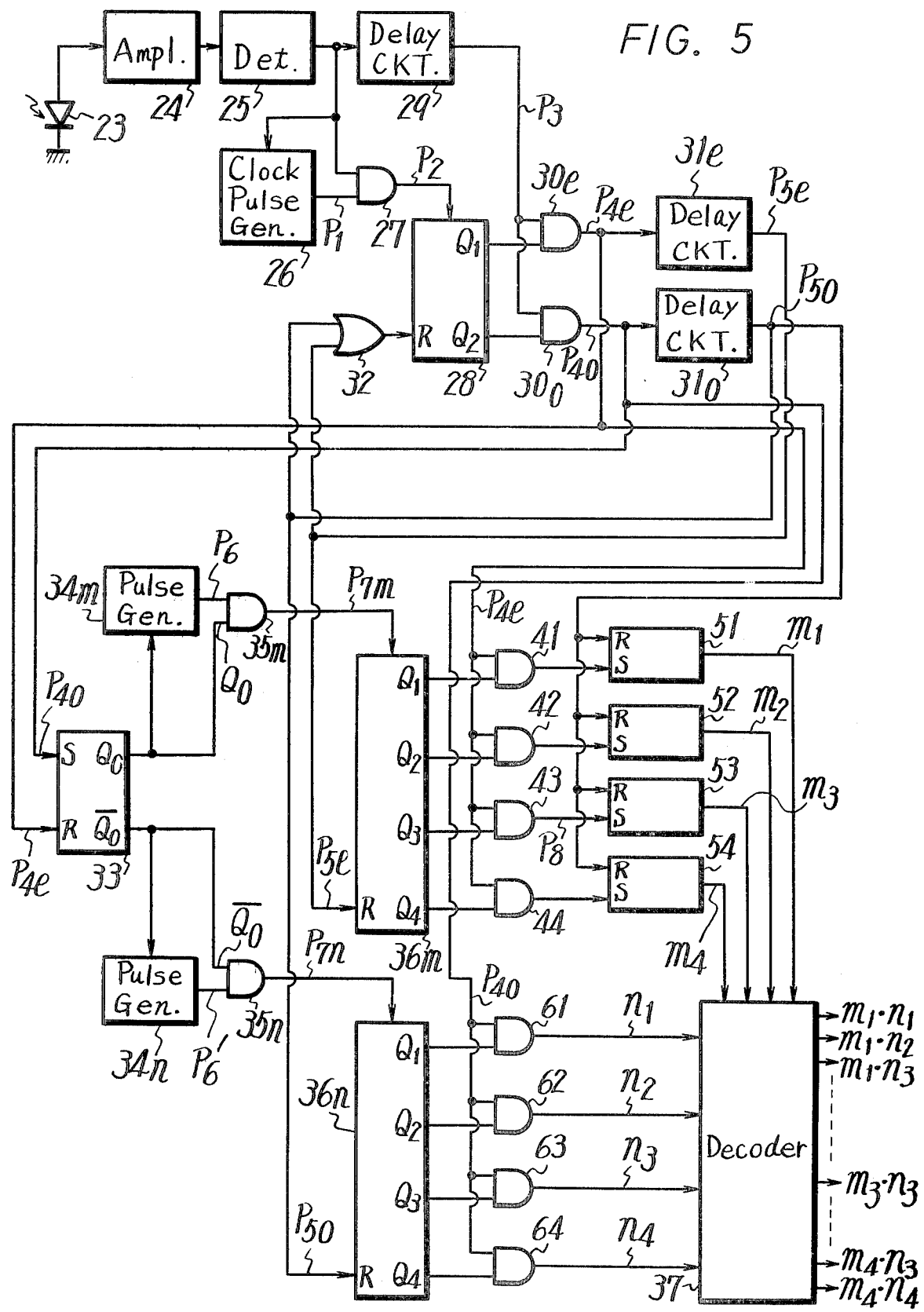
FIG. 5 is a block diagram showing an example of a command decoding device which embodies the present invention.

Next, a command decoding device embodying the present invention will be described with reference to FIGS. 5 and 6A to 6P. This device is designed to decode the infra-red pulses emitted from the previously described encoding device. The infra-red pulses emitted from the encoding device are sequentially received by a photo-diode 23, which then produces a corresponding electrical signal. This electrical signal is fed through an amplifier 24 to detecting circuit 25, which detects the applied signal in the form of an envelope and produces an output signal that reproduces the originally transmitted pulse signal $P_o$ with the first pulse duration $t_o$ and the originally transmitted pulse signal $P_e$ with the second pulse duration $t_e$, as shown in FIG. 6A. The period from the leading-edge of the pulse signal $P_o$ to the leading-edge of the pulse signal $P_e$ defines the first time interval $T_m$, and the period from the leading-edge of the pulse signal $P_e$ to the leading-edge of the following pulse signal $P_o$ defines the second time interval $T_n$. FIG. 6A shows the case in which $T_m = T_{m3}$, $T_n = T_{n3}$ and $T_m = T_n$.

Means for producing a first indication $P_{4o}$ in response to the receipt of a pulse signal $P_o$ and for producing a second indication $P_{4e}$ in response to the receipt of a pulse signal $P_e$ will be now described. Such means can also be thought of as means for discriminating between the duration of leading and falling edge signal pulses and for producing leading and falling edge indications in response to the receipt thereof, respectively. This discrimination is performed by detecting the durations $t_o$ and $t_e$ of the pulse signals $P_o$ and $P_e$ with a clock pulse generator 26, AND-gate 27 and 2-bit counter 28. The clock pulse generator 26 receives the output from the detector 25 and when the output is high, the clock pulse generator produces a clock pulse $P_1$ having a period equal to $t_e$, which is equal to $t_o/2$. The clock pulse $P_1$ and the output from the detector 25 are supplied to the AND-gate 27. When the clock pulse $P_1$ is as shown in FIG. 6B, and the output from detector 25 is as shown in FIG. 6A, the output $P_2$ from the AND-gate 27 becomes as shown in FIG. 6C. The pulses $P_2$ from the AND-gate 27 are applied to the clock input of the 2-bit counter 28, so that only the lower bit $Q_1$ of the counter 28 remains high after the detection of a pulse signal $P_o$ and so that only the higher bit $Q_2$ of the counter 28 remains high after the detection of a pulse signal $P_e$. A delay circuit 29 receives the output from the detector 25 and then produces a pulse signal $P_3$ which is delayed by $t_d$ ($t_d > t_o$) from the rising edge of each of the pulse signals $P_o$ and $P_e$ as shown in FIG. 6D. This pulse signal $P_3$ is supplied to AND-gates $30_o$ and $30_e$. The AND-gate $30_o$ is also supplied with the upper bit $Q_2$ from the counter 28, while the AND-gate $30_e$ is supplied with the lower bit $Q_1$ from the counter 28, so that output pulses $P_{4o}$ and $P_{4e}$ from the AND-gates $30_o$ and $30_e$ become as shown in FIGS. 6E and 6F, respectively.

The pulse signals $P_{4o}$ and $P_{4e}$ are applied to delay circuits $31_o$ and $31_e$, respectively each of which has the delay time of $\Delta t$, so that these delay circuits $31_o$ and $31_e$ produce reset pulses $P_{5o}$ and $P_{5e}$ as shown in FIGS. 6G and 6H, respectively. The counter 28 is reset through an OR-gate 32 by either pulse $P_{5o}$ or $P_{5e}$.

The pulse signals $P_{4o}$ and $P_{4e}$ are applied to the set and reset inputs, respectively, of a bistable means comprising a flip-flop 33. The flip-flop 33 is set by the leading edge of the pulse signal $P_{4o}$ and reset by the leading edge of the pulse signal $P_{4e}$. As a result, one output $Q_o$ of the flip-flop 33 remains high during the length of time interval $T_m$, as shown in FIG. 6I, while the other output $\overline{Q}_o$ of the flip-flop 33 remains high during the length of time interval $T_{n3}$, as shown in FIG. 6J. The outputs $Q_o$ and $\overline{Q}_o$ from the flip-flop 33 are respectively applied to pulse generators $34_m$ and $34_n$, which produce clock pulses $P_6$ and $P'_6$ when the output $Q_o$ and $\overline{Q}_o$ are high, respectively. The clock pulses $P_6$ and $P'_6$ are equal in period to $\tau$. The output $Q_o$ and the clock pulse $P_6$ are fed to an AND-gate $35m$, while the output $\overline{Q}_o$ and the clock pulse $P'_6$ are fed to an AND-gate $35n$. Accordingly, the AND-gate $35m$ produces an output pulse $P_{7m}$, which is shown in FIG. 6K and is fed to the clock input of a counter $36_m$, while the AND-gate $35_n$ produces an output pulse $P_{7n}$, which is shown in FIG. 6L and is fed to the clock input of a counter $36_n$. The counters $36_m$ and $36_n$ are each formed so that one, and only one, of its outputs $Q_1$ to $Q_4$ becomes high in response to the receipt of a given number of clock pulses. For example, when only one clock pulse is received, output $Q_1$ becomes high. Similarly, when 2, 3 and 4 clock pulses are received the outputs $Q_2$, $Q_3$ and $Q_4$ become high, respectively. The counter $36_m$ and $36_n$ are reset by the reset pulses $P_{5e}$ and $P_{5o}$ from the delay circuits $31_e$ and $31_o$, respectively.

As described above, the outputs from the counter $36_m$ vary as a function of the length of time $T_m$ between a given pulse signal $P_{4e}$ and the pulse signal $P_{4o}$ which immediately precedes it. The output $Q_1$ to $Q_4$ from the counter $36_m$ are respectively applied to AND-gates 41 to 44, each of which is also supplied with the pulse signal $P_{4e}$ from the AND-gate $30_e$. The outputs from the AND-gates 41 to 44 are applied to the set inputs of flip-flops 51 to 54 respectively. The reset pulse $P_{5o}$ from the delay circuit $31_o$ is connected to the reset input of each of the flip-flops 51–54. Outputs $m_1$ to $m_4$ from the flip-flops 51 to 54 can be used as means for providing a command signal which varies as a function of the count produced in the counter $36_m$.

Similarly, the outputs from the counter $36_n$ vary as a function of the length of time $T_n$ between a given pulse signal $P_{4o}$ and the pulse signal $P_{4e}$ which immediately precedes it. The outputs $Q_1$ to $Q_4$ from the counter $36_n$ are respectively applied to AND-gates 61 to 64, each of which is commonly supplied with the pulse signal $P_{4o}$ from the AND-gate $30_o$. The outputs $n_1$ to $n_4$ from the AND-gates 61 to 64 can be used as means for providing a command signal which varies as a function of the count produced in the counter $36_n$.

The outputs $m_1$ to $m_4$ from the flip-flops 51 to 54 and the outputs $n_1$ to $n_4$ from the AND-gates 61 to 64 are fed to a decoder 37. This decoder 37 includes 16 AND-gates (not shown), each of which is supplied with one of the outputs $m_1$ to $m_4$ from the flip-flops 51 to 54 and one of the outputs $n_1$ to $n_4$ from the AND-gates 61 to 64. The 16 outputs from the 16 AND-gates in the decoder 37, $m_1 \cdot n_1$, $m_1 \cdot n_2$, $m_1 \cdot n_3$–$m_3 \cdot n_3$–$m_4 \cdot n_3$, $m_4 \cdot n_4$, are a means for providing a command signal which varies as a function of the count produced in counter $36_m$ and the count produced in counter $36_n$.

In the above example, the first and second time intervals $T_m$ and $T_n$ are each equal to $3\tau$ so that the outputs $Q_3$ of both counters $36_m$ and $36_n$ become high. Accordingly, a pulse $P_8$, shown in FIG. 6M, is produced at the output terminal of the AND-gate 43 and hence the flip-flop 53 is set by the pulse $P_8$. Since the flip-flop 53 is reset by the pulse $P_{5o}$, the pulse $m_3$ from that flip-flop is as shown in FIG. 6N. Just before pulse $P_{5o}$ resets the flip-flop 52, the pulse $n_3$, shown in FIG. 6O, appears at the output of the AND-gate 63. Since the pulses $m_3$ and $n_3$ are fed to the decoder 37, the command signal $m_3 \cdot n_3$, shown in FIG. 6P, is provided by that decoder.

According to the present invention, as described above, various command signals are communicated by indicating the length of a first and second time interval $T_m$ and $T_n$, respectively. The beginning and end of these time intervals are indicated by the pulse signal $P_o$ and $P_e$. Since pulse signals $P_o$ and $P_e$ can be chosen so that their total pulse duration is less than the minimum period of either the first or the second time intervals, the power required for transmission can be reduced. As a result the present invention is very effective for use in portable transmitters operated by battery, such as portable infra-red radiation transmitters. Furthermore, since the present invention makes it possible to reduce the length of transmission time required to communicate a command signal, the probability that an interferring signal will interrupt the receipt of such transmission can likewise be reduced, so that the chance that command signals will be misread can be largely avoided.

Having described specific preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

We claim as our invention:

1. A command encoding device for a remote control apparatus, comprising:
    means for defining a repeating sequence of first time intervals having a first variable length related to a command;
    means for defining a repeating sequence of second time intervals contiguous to and alternating with said first time intervals and having a second variable length further related to said command;
    means for producing a repeating sequence of first fixed length pulses having a length shorter than said first and second variable lengths and defining a beginning of each of said first time intervals and an ending of each of said second time intervals;
    means for producing a repeating sequence of second fixed length pulses having a length different from said length of the first fixed length pulses and shorter than said first and second variable lengths and defining an ending of each of said first time intervals and a beginning of each of said second time intervals; and
    means for transmitting said first and second fixed length pulses.

2. In a remote control apparatus, a command encoding device comprising:
    means for indicating the beginning and end of a time interval of length which is a function of a command to be encoded, said means for indicating including means for producing a timing pulse having a width corresponding to said length of said time interval;
    means for initiating a pulse of a first duration shorter than said time interval in response to said beginning of said time interval, said means for initiating a pulse of said first duration including means for detecting the leading edge of said timing pulse;
    means for initiating a pulse of a second duration different from said first duration and shorter than said timer interval in response to said end of the latter, said means for initiating a pulse of said second duration including means for detecting the falling edge of said timing pulse; and
    means for sequentially transmitting said pulse of said first and second durations, respectively.

3. In a remote control apparatus, a command encoding device as in claim 2; wherein
    said means for producing a timing pulse is repeatedly operative to produce a series of timing pulses with second time intervals interposed therebetween, each of said second time intervals being of a length which is also a function of the command to be encoded and is longer than said first and second durations.

4. In a remote control apparatus, a command decoding device comprising:
    means for receiving a repeating sequence of pulses of a first fixed duration alternating with a repeating sequence of pulses of a second fixed duration different from said first fixed duration;
    means for producing a first indication in response to the receipt of said pulse of the first fixed duration and for producing a second indication in response to the receipt of said pulse of the second fixed duration;
    means for producing a first value which varies as a function of the length of time between each said second indication and said first indication which immediately precedes its;
    means for producing a second value which varies as a function of the length of time between each said first indication and said second indication which immediately precedes it; and
    means for providing a command signal as a function of said first and second values.

5. In a remote control apparatus, a command decoding device as in claim 4; wherein
    said pulse receiving means receives a signal comprising alternations between pulses of said first and second durations.

6. In a remote control apparatus, a command decoding device as in claim 5; further comprising
    means for producing a second value which varies as a function of the length of time between each said first indication and said second indication which immediately precedes it; and
    wherein said means for providing a command signal determines said command signal as a function also of said second value.

7. A remote control apparatus comprising:
    means for indicating the beginning and end of each of a repeating sequence of first time intervals having a first length which is a function of a command to be encoded;
    means for indicating the beginning and end of each of a repeating sequence of second time intervals interposed between successive first time intervals and having a second length which is a further function of said command to be encoded;
    means for initiating a repeating sequence of pulses of a first duration shorter than said first and second time intervals in response to said beginning of each of said first time intervals and said end of each of said second time intervals;
    means for initiating a repeating sequence of pulses of a second duration different from said first duration and shorter than said first and second time intervals in response to said end of each of said first time intervals and said beginning of each of said second time intervals;
    means for sequentially transmitting said pulses of said first and second durations, respectively;
    means for receiving said sequentially transmitted pulses of said first and second durations;
    means for producing a first indication in response to the receipt of each said pulse of the first duration and for producing a second indication corresponding to the receipt of each said pulse of the second duration;

means for producing a first value which varies as a function of the length of time between each said second indication and said first indication which immediately precedes it;

means for producing a second value which varies as a function of the length of time between each said first indication and said second indication which immediately precedes it; and means for providing a command signal as a function of said first and second values.

8. A remote control apparatus comprising:

means for producing a command pulse, the duration of which is a function of a command to be transmitted;

means for producing a leading edge signal pulse in response to the leading edge of said command pulse, said leading edge signal pulse having a duration shorter than the command pulse;

means for producing a falling edge signal pulse in response to the falling edge of said command pulse, said falling edge signal pulse having a duration shorter than the command pulse and different from the duration of said leading edge signal pulse;

means for sequentially transmitting said leading and falling edge signal pulses;

means for sequentially receiving said leading and falling edge signal pulses;

means for discriminating between the durations of said leading and falling edge signal pulses and for producing a leading edge indication in response to the receipt of a leading edge signal pulse and for producing a falling edge indication in response to the receipt of a falling edge signal pulse;

bistable means for assuming first and second states in response to said leading edge indication and said falling edge indication, respectively.

a clock for generating clock pulses in response to one of said states of said bistable means;

means for counting said clock pulses; and means for providing a command signal as a function of the count produced by said counting means.

9. A remote control apparatus as in claim 8; wherein said bistable means is a set-reset flip-flop circuit which is set by said leading edge indication and is reset by said falling edge indication.

10. A remote control apparatus as in claim 9; wherein said clock generates pulses in response to said flip-flop circuit being in the set state; and further comprising a second clock for generating pulses in response to said flip-flop circuit being in the reset state, and means for counting the pulse of said second clock; said means for providing a command signal doing so as a function also of the count produced by said means for counting said pulses of the second clock.

* * * * *